United States Patent [19]

Boytim et al.

[11] Patent Number: 5,566,212
[45] Date of Patent: Oct. 15, 1996

[54] PHASE-LOCKED LOOP CIRCUIT FOR MANCHESTER-DATA DECODING

[75] Inventors: Mathew A. Boytim, Westfield, Ind.; Francis M. Palazzolo, Auburn Hills, Mich.

[73] Assignee: Delco Electronics Corporation, Kokomo, Ind.

[21] Appl. No.: 427,013

[22] Filed: Apr. 24, 1995

[51] Int. Cl.$^6$ .............................. H03D 3/22; H03D 3/24
[52] U.S. Cl. ..................... 375/333; 375/359; 375/361; 375/374; 375/376
[58] Field of Search .............................. 375/214, 333, 375/359, 361, 373, 374, 376, 200, 208, 322, 329, 279, 282; 331/18, 25, 1 A, 1 R; 329/304, 306, 307, 308, 309, 310; 455/205

[56] References Cited

U.S. PATENT DOCUMENTS

| | | | |
|---|---|---|---|
| 3,626,298 | 12/1971 | Paine | 375/376 |
| 4,596,985 | 6/1986 | Bongard et al. | 340/825.69 |
| 4,602,253 | 7/1986 | Kreft | 340/825.31 |
| 4,641,322 | 2/1987 | Hasegawa | 375/200 |
| 4,652,860 | 3/1987 | Weishaupt et al. | 340/539 |
| 4,686,529 | 8/1987 | Kleefeldt | 340/825.69 |
| 4,758,835 | 7/1988 | Rathmann et al. | 340/825.31 |
| 4,763,121 | 8/1988 | Tomoda et al. | 340/825.54 |
| 4,794,268 | 12/1988 | Nakano | 307/10 AT |
| 4,847,614 | 7/1989 | Keller | 340/825.56 |
| 4,928,098 | 5/1990 | Dannhaeuser | 340/825.56 |
| 4,962,332 | 5/1990 | Komuro et al. | 364/424.05 |
| 5,023,891 | 6/1991 | Johnson, III | 375/333 |
| 5,055,701 | 10/1991 | Takeuchi | 307/10.2 |
| 5,115,236 | 5/1992 | Kohler | 340/825.69 |
| 5,375,141 | 12/1994 | Takahashi | 375/208 |
| 5,438,589 | 8/1995 | Nakamura | 375/200 |

OTHER PUBLICATIONS

Kady, "Questions from SSR (RFA) Presentation to Honda", Jan. 20, 1993.
Loisch, Patent Review Regarding Kady/Palazzolo to Keyless Entry Claims, Mar. 26, 1993, pp. 1–8.

Primary Examiner—Wellington Chin
Assistant Examiner—Huong Luu
Attorney, Agent, or Firm—Jimmy L. Funke

[57] ABSTRACT

A phase-locked loop circuit recovering original clock information and original stream of binary data both from Manchester-coded data is disclosed. The phase-locked loop circuit comprises first, second, and third exclusive-OR circuits each with two inputs and an output. The phase-locked loop circuit further comprises a controlled oscillator that generates two local clock signals that are phase shifted from each other, preferably by an amount of 90°, with the first being at 0° phase shift. The 0° clock signal is applied to one input of the first exclusive-OR circuit having Manchester-coded data at its other input. The 90° phase shifted clock is applied to one input of the second exclusive-OR circuit having Manchester-coded data at its other input. The output of each of the first and second exclusive-OR circuits, after passing through associated circuitry, is applied to the third exclusive-OR circuit. The third exclusive-OR circuit produces an output signal having a frequency that is directly proportional to that of the original clock information. The output signal of the third exclusive-OR circuit is applied to the input of controlled oscillator which, in turn, locks the 0° output phase shift to the Manchester-coded data allowing the stream of binary bits to be stripped therefrom. The frequency of the 0° output phase signal, by the means of operation of the controlled oscillator, becomes or corresponds to that of the original clock information.

3 Claims, 2 Drawing Sheets

5,566,212

PHASE-LOCKED LOOP CIRCUIT FOR MANCHESTER-DATA DECODING

TECHNICAL FIELD

The present invention relates to a decoding circuit used in data communication systems. More particularly, the present invention relates to a phase-locked loop circuit used for decoding Manchester-coded data signals. Specifically, the phase-locked loop circuit comprises three exclusive-OR circuits that recover the original clocked information and the original stream of binary data from the Manchester-coded data without suffering from erroneous decoding sometimes caused by noise transients on the signal paths carrying the Manchester-coded data.

BACKGROUND OF THE INVENTION

Phase-locked loop circuits are commonly used in data communication systems to recover the original clock information and the original stream of binary data from Manchester-coded data, and such circuits are described in U.S. Pat. No. 4,565,976 ('976) that utilizes an arrangement of two voltage-controlled oscillators and U.S. Pat. No. 4,546,486 ('486) that utilizes edge-detecting circuits; both of which U.S. Patents are herein incorporated by reference. The phase-locked loop circuits commonly comprise one or more oscillators, serving as local clocks, whose output phase and/or frequency are "steered" to keep them in sync (lock on) with the received Manchester-coded data.

Manchester-coded data comprising a plurality of binary bits, commonly referred to as data bit cells each having a known period, may be defined herein with reference to FIG. 1. As seen in FIG. 1, a logic "1" is characterized by the transition from a "0" (logic "low" level) to a logic "1" (logic "high" level), in the middle of a data bit cell. A logic "0" is defined by a transition from a "1" (logic "high" level) to a logic "0" (logic "low" level) in the middle of a data bit cell. As further used herein, a logic "0" will be simply referred to as a "0" and, similarly, a logic "1" will be simply referred to as a "1."Manchester-coded data transitions can occur at both the edges of the data bit cells and in the middle of data bit cells. These transients may be difficult to distinguish especially in the presence of noise. More particularly, the signal paths carrying the "1's" and "0's" of the Manchester-coded data may be subjected to noise transients which could possibly be interpreted as data, especially if edge-detection circuits are used in the decoding circuit. Furthermore, these noise transients may occur throughout the data communication system employing Manchester-coded data. If such difficulties are experienced, the particular phase-locked loop circuit may be unable to lock its local clock onto the Manchester-coded data and, thus, be unable to satisfactorily recover the original clock information and the original stream of binary data from the Manchester-coded data transmissions.

SUMMARY OF THE INVENTION

It is, therefore, the principal object of the present invention to provide a phase-locked loop circuit having a high immunity to noise and used for recovering the original clock information and the original stream of binary data from Manchester-coded data.

Another object of the present invention is to provide a phase-locked loop circuit that is devoid of edge detector devices so as to further reduce its susceptibility to noise.

It is another object of the present invention to provide a method of recovering the original clock information and the original stream of binary data from Manchester-coded data without suffering the drawbacks of erroneously decoding noise transients as coded data.

Other objects of the present invention, as well as advantages thereof over existing prior art forms, will be apparent in view of the following description accomplished by means hereinafter described and claimed.

In general, phase-locked loop circuits embodying the concepts of the present invention utilize an arrangement of exclusive-OR circuits that decode the original clock information having a known approximate frequency and the original stream of binary data both from Manchester-coded data. The phase-locked loop circuits of the present invention are not susceptible to the drawbacks of using edge-detection techniques that might misinterpret noise in the data communication system as being proper data.

In one embodiment, a phase-locked loop circuit comprises a frequency generator and first, second, and third exclusive-OR circuits each having first and second inputs and an output. The frequency generator is responsive to an applied signal that determines its output frequency. The frequency generator generates first and second output phase signals that are displaced from each other by a predetermined phase, which is greater than 0° but less than 360° with the first being at 0° output phase shift and the second preferably being at 90° output phase shift. The first output phase signal being of a frequency corresponding to the frequency of the original clock of the Manchester-coded data. The first exclusive-OR circuit has its first input connected to receive the Manchester-coded data and its second input connected to receive the first (0°) output phase signal. The second exclusive-OR circuit has its first input connected to receive the Manchester-coded data and a second input connected to receive the second (90°) output phase signal. The third exclusive-OR circuit has its first input connected to receive an output signal representative of the output of the first exclusive-OR circuit and its second input connected to receive an output signal representative of the output of the second exclusive-OR circuit. The output signal of the third executive-OR circuit is applied to the input of the frequency generator and causes the first output phase signal to lock onto the Manchester-coded data and to serve as the recovered original clock information.

In other embodiments, means are connected to the output of the first and second exclusive-OR circuits for examining each data bit cell, having a known period, of the Manchester-coded data and each data bit cell of the Manchester-coded data phase shifted, preferably, by 90°, to determine if each bit of both data primarily comprises a "0" or "1" and to provide a corresponding output signal therefor. For these other embodiments, the phase-locked loop circuit further comprises switch means periodically activated so as to correspondingly sample the coded data at the end of each period of the data bit cells. Further embodiments may also comprise register means, serving as a decision block, connected to the output of the first switch means and generating an output signal "1" or "0" representative of the sampled data.

DESCRIPTION OF EXEMPLARY EMBODIMENTS

Figure 1:
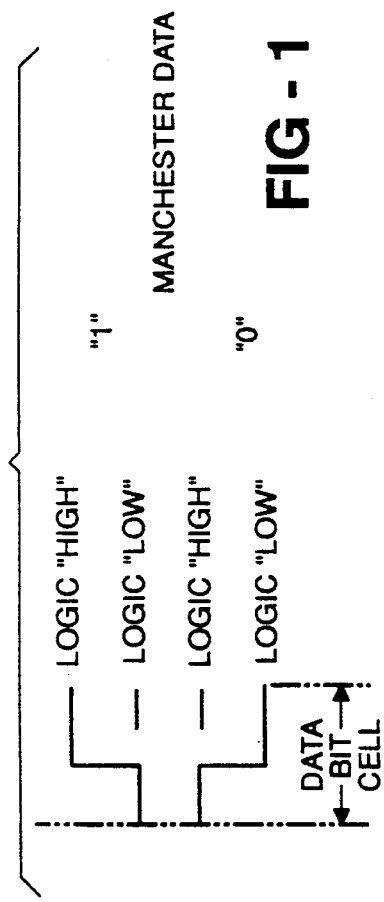
FIG. 1 is an illustration of the Manchester-coded data related to the data communication system of the present invention.
Figure 2:
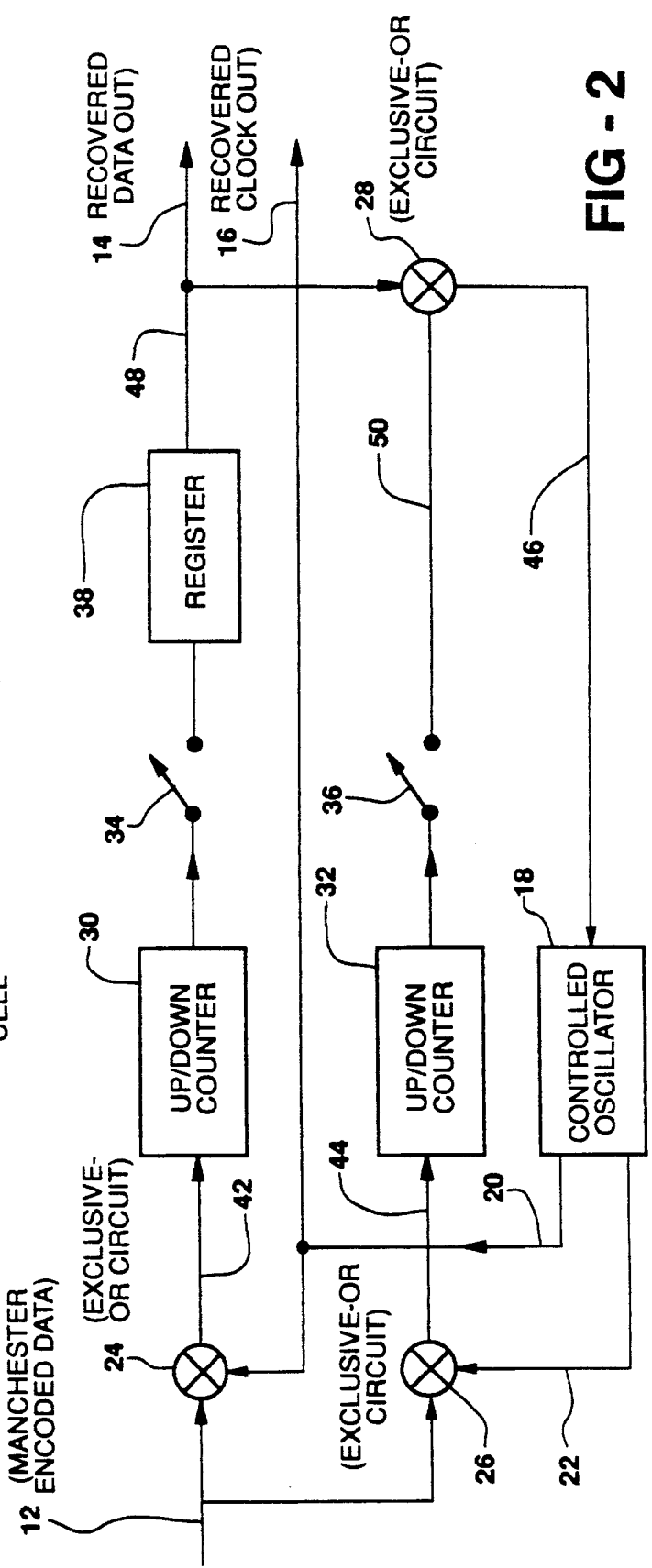
FIG. 2 is a block diagram of the phase-locked loop circuit of the present invention.

Referring to the drawings, wherein like reference numbers designate like elements, there is shown in FIG. 2 a block diagram of a phase-locked circuit 10 to which is applied, at its input stage, Manchester-coded data 12, previously described with reference to FIG. 1. The phase-locked loop circuit 10 recovers and makes available, at its output stage, the original stream of binary data 14 and the original clock information 16 having a known approximate frequency with both the data and clock being embedded in the Manchester-coded data 12. The phase-locked loop circuit 10 includes a controlled oscillator 18 whose 0° output phase and frequency is "steered" or "locked" to keep it in synchronization with the Manchester-coded data 12. More particularly, the operation of the phase-locked loop circuit 10 causes the frequency of the controlled oscillator 18 to become that of the original clock information embedded in the Manchester-coded data 12.

The controlled oscillator 18 may be a voltage-controlled oscillator whose output frequency varies with an applied dc voltage. Similarly, the controlled oscillator 18 may be a counter arrangement in which the output frequency of the oscillator 18 varies in accordance with the number of pulses applied to its input. In either embodiment, the controlled oscillator 18 serves as a frequency generator responsive to an applied input signal that determines its output frequency. The controlled oscillator 18 generates first and second signals 20 and 22 that are displaced from each other by a predetermined phase which is greater than 0°, but less than 360°. The first signal 20 is a 0° output phase signal, whereas the second signal 22 is, preferably, a 90° output phase signal.

In addition to the controlled oscillator 18, the phase-locked loop circuit 10 comprises first, second and third mixers 24, 26 and 28 each having first and second inputs and an output, integrate and dump circuits 30 and 32, first and second switch means 34 and 36, and a decision block network 38.

The first, second and third mixers 24, 26 and 28 are each in actuality an exclusive-OR circuit. The exclusive-OR circuits 24, 26 and 28 respectively provide output signals 42, 44 and 46 which are respectively a "1" whenever either of their two inputs is a "1," but is a "0" when both of their inputs are "1," or when both of their inputs are "0." The first exclusive-OR circuit 24 has its first input connected to receive the Manchester-coded data 12 and its second input connected to receive the first (0°) output phase shift signal 20. Similarly, the second exclusive-OR circuit 26 has its first input also connected to receive the Manchester-coded data 12 and its second input connected to receive the second (90°) output phase shift signal 22. The third exclusive-OR circuit 28 has its first input signal connected to receive signal 48, which is representative of the output signal 42 of the first exclusive-OR circuit 24. The third exclusive-OR circuit 28 has its second input connected to receive signal 50, which is representative of the output signal 44 of the second exclusive-OR circuit 26.

The integrate and dump circuits 30 and 32 may comprise similar circuitry as described for the integrate and dump circuit 54 given in the previously incorporated by reference U.S. Pat. No. 4,546,486. The integrate and dump circuit 30 is connected to the output 42 of the first exclusive-OR circuit 24 and the integrate and dump circuit 32 is connected to the output 44 of the second exclusive-OR circuit 26. In general, integrate and dump circuit 30 examines each data bit cell of the original stream of binary data embedded in the Manchester-coded data, to be described, to determine if each cell primarily comprises a "0" or a "1" and generates a corresponding 0 or 1 output. Similarly, the integrate and dump circuit 32 examines, in a similar manner as that of the integrate and dump circuit 30, each data bit cell of the output signal 44 which comprises, as to be described, a stream of binary data bits that are displaced from the original stream of data of circuit 30 by the previously mentioned predetermined phase shift. The integrate and dump circuits 30 and 32 respectively provide output signals to switch means 34 and 36.

The switch means 34 and 36 are preferably electronic devices which are activated at the end of the period of each data bit cell. The switch means 34 routes its sampled output of the integrate and dump circuit 30 to decision block network 38 for further processing thereof, to be described, and the decision block network 38, in turn, generates an output signal 48 which is applied to the first input of the exclusive-OR circuit 28. Similarly, the switch means 36 routes its sampled output of the integrate and dump circuit 32, shown as signal 50, preferably and directly to the second input of the exclusive-OR circuit 28. The exclusive-OR circuit 28, in response to the correspondence between signals 48 and 50, generates its output signal 46 which is applied directly to the input of the controlled oscillator 18. The operation of the exclusive-OR circuit 28, as well as the overall operation of the phase-locked loop circuit 10 may be described with reference to FIG. 3.

Figure 3A:
FIG. 3 is composed of FIGS. 3(A), (B), (C), (D), (E), and (F) all of which serve as timing diagrams primarily illustrating the operation of the three mixers of FIG. 2 each of which mixers function as an exclusive-OR circuit.

FIG. 3 is composed of FIG. 3(A), (B), (C), (D), (E), and (F), which respectively illustrate the wave shapes of signals 12 (Manchester-coded data), 42, 20, 22, 44 and 46 of FIGS. 1 and 2. The composite of FIG. 3 serves as a timing diagram that primarily illustrates the operation of the exclusive-OR circuits 24, 26 and 28 in response to the related signals correlated thereto in Table 1.

TABLE 1

Figure 3B:
Figure 3C:
Figure 3D:
Figure 3E:
Figure 3F:

| EXCLUSIVE-OR CIRCUIT | FIRST INPUT | SECOND INPUT | OUTPUT |
|---|---|---|---|
| 24 | FIG. 3(A) | FIG. 3(C) | FIG. 3(B) |
| 26 | FIG. 3(A) | FIG. 3(D) | FIG. 3(E) |
| 28 | FIG. 3(B) | FIG. 3(E) | FIG. 3(F) |

With reference to FIG. 3, more particularly, to the correlated three elements of Table 1 related to the exclusive-OR circuit 24, it is seen that the output signal 42 (FIG. 3(B)) is a "1" whenever either of the two inputs (FIGS. 3(A) and (C)) is a "1," but is a "0" when both inputs (FIGS. 3(A), (C)) are a "1," or when both inputs (FIGS. 3(A) and (C)) are a "0." Initially, the signal 20 (FIG. 3(C)) serves as an imperfect recovered clock signal 16 of the clock information of the Manchester-coded data 12, but because of the operation of the phase-locked loop circuit 10 is transitioned to become an exact recovered clock signal 16. To establish the imperfect clock signal 20, the controlled oscillator 18 is initially set to the known approximate frequency of the original clock information embedded in the Manchester-coded data 12, and then the operation of the phase-locked loop circuit 10 locks (to be described) the clock signal 20 onto the Manchester-coded data so as to produce the exact recovered clock signal 16.

With reference to FIG. 3, more particularly, to the correlated three elements of Table 1 related to exclusive-OR circuit 26, it is seen that signal 44 is "1" whenever either of the two inputs (FIGS. 3(A) and (D)) is a "1," but is a "0" when both inputs (FIGS. 3(A) and (D)) are a "1" or when both inputs (FIGS. 3(A) and (D)) are a "0." When the circuit 10 is nearly phase locked with the Manchester-coded data, i.e., the signal 20 is nearly at the same frequency as the frequency of the original clock information, the exclusive-OR 26 acts as a type 1 phase comparator, i.e., a level-sensitive device and does act like any prior art edge-sensitive device having the inherent drawbacks previously described.

Again, with reference to FIG. 3, more particularly, to the correlated three elements of Table 1 related to the exclusive-OR circuit 28, it is seen that the signal 46 is "1" whenever either of the two inputs (FIGS. 3(B) and (E)) is "1," but is a "0" when both inputs (FIGS. 3(B) and (E)) are a "1" or when both inputs (FIGS. 3(B) and (E)) are a "0." Because exclusive-OR circuit 26 combines input data (FIG. 3(A)) with the 90° clock (FIG. 3(D)), phase information that is routed to the input of the exclusive-OR circuit 28, by way of signal path 50 (see FIG. 1), is correct in magnitude, but may have a sign ambiguity inherent from the input data (FIG. 3(A)). The operation of the exclusive-OR circuit 28, having input signals 48 and 50, corrects for the sign ambiguity of the phase information of the exclusive-OR circuit 26 and provides the output signal 46 that is routed to and serves as the control signal that determines the output frequency of the controlled oscillator 18.

As it is seen from FIG. 3(F), signal 46 has a frequency that varies directly as the frequency of signals 20 and 22. More particularly, for the 0° output phase signal 20 and the predetermined phase shift of 90° preferably selected for signal 22, the signal 46 of FIG. 3 has a repetition rate which is twice that of either signal 20 or 22 so that its frequency is also twice that of either signal 20 or 22. Furthermore, the signal 46 is generated in response to the signals 42 and 44 (actually signals 48 and 50 to be described) each of which are generated (by the operation of their exclusive-OR circuits 24 and 26 respectively) in response to the Manchester-coded data 12 having embedded therein the original clock information and the original stream of binary data. Further, as previously discussed with reference to FIG. 2, the frequency generated by the controlled oscillator 18 varies directly as the control signal, i.e., signal 46. Accordingly, the response of the controlled oscillator 18 to signal 46 causes the frequency of the oscillator output signals 20 and 22, in particular the 0° output phase signal 20, to be phase-locked with the Manchester-coded data of FIG. 3(A). The phase-locked signal 20 causes the operation of exclusive-OR circuit 24 to strip the embedded data (signal 42) from the Manchester-coded data 12. Further, the signal 20, locked to the Manchester-coded data 12, becomes and corresponds to the original clock information embedded in the Manchester-coded data 12. Once phase-locked is obtained, the integrate and dump circuits 30 and 32, samplers 34 and 36, and decision block 38 cause the phase-locked loop circuit 10 to provide a matched filter for optimum data recovery of the Manchester-coded data 12. More particularly, the phase-locked loop circuit 10 provides input and output impedances that are matched to the input lines carrying the Manchester-coded data 12 and to the output loads receiving the recovered data output 14 and recovered clock output 16. The matched filter provided by the phase-locked loop circuit 10 further reduces the circuit's susceptibility to erroneously reacting to noise transients.

It should now be appreciated that the broad concepts of the present invention provide for a phase-locked loop circuit 10 that are achieved by the arrangement of the controlled oscillator 18 and first, second and third exclusive-OR circuits 24, 26 and 28, and that allow for the original clock information and the original stream of binary data to be stripped or recovered from the Manchester-coded data 12.

As discussed in the Background section, the Manchester-coded data 12 may be subjected to noise which, in turn (without the benefits of the present invention), may be interpreted as the transitions of the logic levels occurring during the data bit cells of the Manchester-coded data 12 previously discussed with reference to FIG. 1. The use of the exclusive-OR circuits 24, 26 and 28, devoid of any edge-detection operation, reduces the phase-locked loop circuit 10 sensitivity to these noise transient problems and the combination of integrate and dump circuits 30 and 32, switch means 34 and 36, and the decision block 38 further increases the noise immunity of the phase-locked loop circuit 10.

The integrate and dump circuits 30 and 32 may each comprise up/down counter means having a count rate that is a predetermined increment of the period of the data bit cell of the Manchester-coded data. More particularly, the count rate may be selected by dividing the period of the data bit cell into, for example, sixty-four (64) increments so that each count cycle includes sixty-four (64) incremental counts. The contents of the count of the first and second up/down counters 30 and 32 are reset at the end of the period of each data bit cell. The up/down counters 30 and 32 count up, in incremental steps, during the presence of an apparent "1" contained in each individual data bit cell and count down during the presence of an apparent "0" in the same individual cell. The up/down counters 30 and 32 provide a "1" if the up count exceeds the down count and, conversely, provides a "0" output if the down count exceeds the up count. If desired, the up/down counter 32 may provide raw count outputs which are routed to decision block 38 which, in turn, may provide a "1" or "0" output if the raw count outputs are less than or greater than zero (0), respectively. For either embodiment, if a transient should happen to occur and erroneously cause an up or down count, the remaining down or up counts would factor out the erroneous up/down count so that the integrate and dump circuits 30 and 32 would provide the proper "1" or "0" output in response to their respective input quantities from exclusive-OR circuits 24 and 26. As previously discussed, the output of integrate and dump circuits 30 and 32 are respectively routed, by way of switch means 34 and 36, to decision block network 38 and to exclusive-OR circuit 28.

Decision block network 38 may serve as register means and checks to see if the integrate and dump circuit 30 provided a "1" or "0" and applies that "1" or "0" at its output 48 which is routed to exclusive-OR circuit 28. Alternately, as discussed above, the decision block network 38 may have an appropriate algorithm to decide if its output 48 is a "1" or a "0." The decision block network 38, in cooperation with the integrate and dump circuit 30, adjudges each data bit of the Manchester-coded data as being a "0" or a "1." This cooperative operative of monitoring the condition of the complete data bit eliminates any erroneous response to transient noise, especially as it relates the data that is provided as recovered data output 14.

If desired, the decision block network 38 may be removed from accepting the output of switch means 34 and inserted so as to accept the output of switch means 36 and the same effect of properly adjudging each data bit of Manchester-coded data will be maintained, except that the decision block network 38 will adjudge the related Manchester-coded data that is in correspondence with the second (90°) clock signal 22. The correctly adjudged data derived from signal 22 is routed to the exclusive-OR circuit 28 so that the same effect is achieved as that yielded from the decision block network 38 connected to switch means 34. In addition, a decision block network 38 may be provided for each of the switch means 34 and 36 and, thereby, provide proper adjudgement on both (0° and 90°) data paths.

It should now be appreciated that the practice of the present invention includes integrate and dump circuits 30 and 32 and at least one decision block network 38 that substantially eliminate any response to transient noise that may otherwise erroneously be interpreted as coded data of the Manchester data communication transmission scheme.

It should now be appreciated that the practice of the present invention provides for a phase-locked loop circuit 10 that correctly recovers the original clock information and the original stream of binary data from the Manchester-coder data 12 without erroneously responding to transients that might sometimes appear in or on the Manchester-coded data transmission scheme.

It should be further appreciated that although the hereinbefore given description of the phase-locked loop circuit 10 was particularly suited for a data communication system employing the Manchester-coded data scheme, it should be recognized that the principles of the present invention teach the use of the phase-locked looped circuit for many data communication applications.

What we claim is:

1. A phase-locked loop circuit for recovering original clock information, having a known frequency, and an original stream of binary data from Manchester-coded data having data bit cells, said phase-locked loop circuit comprising:

(a) a controlled oscillator responsive to an applied input signal that determines its output frequency, said controlled oscillator generating first and second output phase signals that are displaced from each other by a predetermined phase shift which is greater than $0°$ but less than 360° with the first output phase signal being a $0°$ output phase signal, said first output phase signal being of a frequency corresponding to that of said original clock information;

(b) a first exclusive-OR circuit having first and second inputs and an output, said first input connected to receive said Manchester-coded data and said second input connected to receive said first output phase signal, said output of said first exclusive-OR circuit comprising data that corresponds to said original stream of binary data of said Manchester-coded data;

(c) a second exclusive-OR circuit having first and second inputs and an output, said first input connected to receive said Manchester-coded data and said second input connected to receive said second output phase signal; and (d) a third exclusive-OR circuit having first and second inputs and an output, said first input connected to receive the output of said first exclusive-OR circuit and said second input connected to receive the output of said second exclusive-OR circuit, said output of said third exclusive-OR circuit being applied to said input of said controlled oscillator.

2. A phase-locked loop circuit for recovering original clock information and an original stream of binary data from Manchester-coded data having cells containing either a "0" or a "1," said phase-locked loop circuit comprising:

(a) a controlled oscillator responsive to an applied input signal that determines its output frequency, said controlled oscillator generating first and second output phase signals that are displaced from each other by a predetermined phase shift which is greater than $0°$ but less than 360°, with the first output phase signal being a 0° output phase signal, said first output phase signal being of a frequency corresponding to that of said original clock information;

(b) a first exclusive-OR circuit having first and second inputs and an output, said first input connected to receive said Manchester-coded data and said second input connected to receive said first output phase signal, said output of said first exclusive-OR circuit comprising data that corresponds to said original stream of binary data of said Manchester-coded data;

(c) first means, connected to said output of said first exclusive-OR circuit, for examining each data bit cell of said original stream of data to determine if it primarily comprises a "0" or a "1" and generating a corresponding "0" or "1" output;

(d) a second exclusive-OR circuit having first and second inputs and an output, said first input connected to receive said Manchester-coded data and said second input connected to receive said second output phase shift signal, said output signal of said second exclusive-OR circuit comprising a stream of data that is displaced from said original stream by said predetermined phase shift;

(e) second means, connected to said output of said second exclusive-OR circuit, for examining each data bit cell of said phase shifted original stream of data to determine if it primarily comprises a "0" or a "1" and generating a corresponding "0" or "1" output; and (f) a third exclusive-OR circuit having first and second inputs and an output, said first input connected to receive the output of said first means for examining and said second input connected to receive the output of said second means for examining, said output of said third exclusive-OR circuit being applied to said input of said controlled oscillator.

3. A phase-locked loop circuit for recovering original clock information and an original stream of binary data from Manchester-coded data having cells containing either a "0" or a "1" with each cell having a known period, said phase-locked loop circuit comprising:

(a) a controlled oscillator responsive to an applied input signal that determines its output frequency, said controlled oscillator generating first and second output phase signals that are displaced from each other by a predetermined phase shift which is greater than $0°$ but less than 360°, with the first output phase shift signal being at $0°$ phase, said first output phase signal being of a frequency corresponding to that of said original clock information;

(b) a first exclusive-OR circuit having first and second inputs and an output, said first input connected to receive said Manchester-coded data and said second input connected to receive said first output phase signal, said output of said first exclusive-OR circuit comprising a stream of binary data corresponding to said original stream of binary data of said Manchester-coded data;

(c) a first up/down counter means having a count rate that is a predetermined increment of said known period of said data bit cell, said first up/down counter means being connected to said output of said first exclusive-OR circuit, said first up/down counter means counting up during the presence of "1" in each individual data bit cell and counting down during the presence of a "0" in the same individual data bit cell, said first up/down counter means providing a "1" output when the up count exceeds said down count, and, conversely, a "0" output when the down count exceeds the up count;

(d) first switch means connected to said output of said first up/down counter means, said first switch means being activated at the end of each data bit cell period and providing an output signal sample corresponding to said output of said first up/down counter means;

(e) register means connected to said output of said first switch means and generating an output signal representative of said output of said first up/down counter means;

(f) a second exclusive-OR circuit having first and second inputs and an output, said first input connected to receive said Manchester-coded data and said second input connected to receive said second output phase signal, said output signal of said second exclusive-OR circuit comprising a stream of data that is displaced from said original stream of data of said Manchester-coded data by said predetermined phase shift of said generating means;

(g) a second up/down counter means having a count rate that is a predetermined increment of said known period of said data bit cell, said second up/down counter means being connected to said output of said second exclusive-OR circuit, said second up/down counter means counting up during the presence of a "1" in each individual data bit cell and counting down during the presence of a "0" in the same individual data bit cell, said second up/down counter providing a "1" when said up count exceeds said down count and a "0" output when said down count exceeds the up count;

(h) second switch means connected to said output of said second up/down counter means, said second switch means being activated at the end of each data bit cell period and providing an output signal sample corresponding to said output of said second up/down counter means;

(i) a third exclusive-OR circuit having first and second inputs and an output, said first input being connected to the output of said register means and said second input connected to said output of said second switch means, said output of said third exclusive-OR circuit being applied to said input of said controlled oscillator.

* * * * *